United States Patent [19]

Sawtell et al.

[11] Patent Number: 5,570,502
[45] Date of Patent: Nov. 5, 1996

[54] FABRICATING METAL MATRIX COMPOSITES CONTAINING ELECTRICAL INSULATORS

[75] Inventors: Ralph R. Sawtell; M. K. Premkumar, both of Monroeville; David I. Yun, Murrysville, all of Pa.

[73] Assignee: Aluminum Company of America, Pittsburgh, Pa.

[21] Appl. No.: 235,018

[22] Filed: Apr. 28, 1994

Related U.S. Application Data

[60] Continuation-in-part of Ser. No. 111,993, Aug. 25, 1993, which is a division of Ser. No. 682,513, Apr. 8, 1991, Pat. No. 5,259,436.

[51] Int. Cl.$^6$ .............................. B22D 19/00; H01L 21/60
[52] U.S. Cl. .............................. 29/527.6; 29/874; 164/97; 164/98; 437/209; 437/215
[58] Field of Search .............................. 29/527.6, 874; 437/209, 215, 225, 228 CON; 164/97, 98

[56] References Cited

U.S. PATENT DOCUMENTS

| | | | |
|---|---|---|---|
| 3,350,763 | 11/1967 | Kingsbury et al. | 29/527.6 X |
| 3,547,180 | 12/1970 | Cochran et al. | |
| 3,721,841 | 3/1973 | Wilson | 29/874 X |
| 4,205,418 | 6/1980 | Przybylek | 29/874 X |
| 4,340,109 | 7/1982 | Roddy | |
| 4,376,804 | 3/1983 | Katzman | |
| 4,573,517 | 3/1986 | Booth et al. | |
| 4,761,345 | 8/1988 | Sato et al. | |
| 4,770,953 | 9/1988 | Horiguchi et al. | |
| 4,777,998 | 10/1988 | Charbonnier | |
| 4,806,704 | 2/1989 | Belke, Jr. et al. | |
| 4,889,177 | 12/1989 | Charbonnier et al. | |
| 4,901,780 | 2/1990 | Sasaki et al. | |
| 4,901,781 | 2/1990 | Ruff | |
| 4,906,511 | 3/1990 | Sato et al. | |
| 4,920,864 | 5/1990 | Skingle et al. | |
| 4,961,461 | 10/1990 | Klier et al. | |
| 5,111,871 | 5/1992 | Cook | |
| 5,130,498 | 7/1992 | Yoshida et al. | |
| 5,259,436 | 11/1993 | Yun et al. | 164/97 |
| 5,371,043 | 12/1994 | Anderson et al. | |

FOREIGN PATENT DOCUMENTS

| | | |
|---|---|---|
| 58-215263 | 12/1983 | Japan . |
| 60-145340 | 7/1985 | Japan . |
| 62-240152 | 10/1987 | Japan . |
| 62-238063 | 10/1987 | Japan . |
| 64-83634 | 3/1989 | Japan . |
| 6484649 | 3/1989 | Japan ................... 437/215 |

OTHER PUBLICATIONS

P. K. Robatgi et al., Solidification Processing of Metal-Matrix Composites, Proceedings of the International Symposium on Advanced Structural Materials, Montreall, Canada, Aug. 22–28, 1985, Pergamon Press, pp. 43–51, 478–481.

M. S. Newkirk et al, Preparation of Lanxide Ceramic Matrix Composites: Matrix Formation by the Directed Oxidation of Molten Metals, Ceram. Eng. Sci. Proc., 8(7–8) pp. 879–885 (1987).

C. R. Cook et al, System Optimization for Squeeze cast Composites, Conference Proceedings of the 1988 World Materials Congress, Sep. 24–30, Chicago, Illinois, pp. 195–204.

*Primary Examiner*—Joseph M. Gorski
*Attorney, Agent, or Firm*—David W. Pearce-Smith

[57] ABSTRACT

A method of fabricating a metal matrix composite containing electrically isolated areas and the MMC formed from the method. The method comprises: (a) providing a liquid pool of unreinforced aluminum alloy; (b) infiltrating the unreinforced aluminum alloy into a stack comprising upper and lower porous preforms and an electrical insulator material placed between the preforms; (c) solidifying the liquid-phase metal to form a metal matrix composite product that completely surrounds the stack; and (d) forming at least one groove in the solidified metal, the groove extending downward to at least one insulating substrate so as to electrically isolate at least one region on the surface of the metal matrix composite.

31 Claims, 5 Drawing Sheets

FABRICATING METAL MATRIX COMPOSITES CONTAINING ELECTRICAL INSULATORS

RELATED APPLICATIONS

The present invention is a continuation-in-part of co-pending U.S. Ser. No. 08/111,993, filed Aug. 25, 1993 entitled "Fabrication of Metal Matrix Composites by Vacuum Die Casting", which is a divisional of Ser. No. 682,513 filed Apr. 8, 1991, now U.S. Pat. No. 5,259,436, issued Nov. 9, 1993.

TECHNICAL FIELD

The present invention relates to methods for fabricating metal matrix composites (MMCs) possessing sections that are electrically insulated from one another. More particularly, the method of the present invention relates to fabricating metal matrix composites with an internal insulating substrate.

BACKGROUND ART

Metal matrix composites provide a relatively new way of producing parts with exceptional stiffness, resistance to wear and resistance to heat. The superior stiffness allows thinner materials to be used and thus reduces the size and weight of the part. Light weight is important in the construction of components for the aerospace industry and the electronics industry.

At the present time, the processes employed for fabrication of MMCs include a vacuum/low pressure infiltration, a high pressure squeeze casting process and a pressureless casting process. These processes have the following characteristics:

Low Pressure/Vacuum Infiltration Process

The process utilizes a combination of vacuum and a low pressure (typically less than 1500 psi) gas for metal infiltration. The process has been employed mainly for fabrication of small numbers of R&D samples. It is designed to be a laboratory-scale process and is not suitable for low cost, high throughput production on a commercial scale.

Pressureless Infiltration Process

The process relies on capillary force for the infiltration. To develop the capillary force, a wetting between aggregate and matrix materials is obtained through a chemical reaction. The process requires the use of special combinations of matrix alloying elements (aluminum with 1 wt. % Mg or higher), heated ceramic aggregates (700° C. or higher) and gas environment (10 to 100 vol. % nitrogen). This process thus limits selection of matrix material, for instance Al-Mg alloys and is burdened by high manufacturing costs due to extended reaction periods. This process is additionally difficult from a process control standpoint due to the sensitive dependence of the process on surface condition and spontaneous wetting.

High Pressure Squeeze Casting Process

For the infiltration, this process utilizes high pressure (10,000 to 30,000 psi) using a large hydraulic or mechanical press. The process has the ability to infiltrate a wide range of aggregate and matrix combinations but is limited as to complexity and dimensional tolerance of the products produced because of limitations in die design imposed by the need for high pressure. The product manufacturing costs are also high because of high capital costs for the large press.

U.S. Pat. No. 4,920,864 generally discloses a closed-die pressure casting process to achieve infiltration of a matrix alloy into the interstices of a fiber preform. U.S. Pat. No. 4,777,998 shows die casting of metal parts possibly containing fibers of ceramic materials, but no attempt is made to utilize vacuum die casting principles.

It was against this background that the present invention was made.

SUMMARY OF THE INVENTION

It is an object of the present invention to provide an MMC production process for fabricating MMCs having electrically isolated areas which have a combination of quality, repeatability and flexibility which is superior to previous processes, particularly for making MMCs having a high volume fraction of aggregate.

Another object of the invention is the provision of aluminum or aluminum alloy and silicon carbide metal matrix composites having unique combinations of electrical properties, thermal expansion coefficient and thermal conductivity.

These as well as other objects which will become apparent from the disclosure which follows are achieved according to the methods of the present invention through the use of a vacuum die casting process for fabrication of MMC products. The process has the ability to produce high quality, net shape, or near net shape, thin walled and MMC materials of complex shape using a variety of aggregate and matrix combinations. The process involves various systems such as machinery, insulating substrates, aggregate, vacuum and metal input.

In accordance with the present invention, there is provided a method of fabricating a metal matrix composite containing electrically isolated areas. The method comprises: (a) placing an insulating substrate in a forming chamber; (b) evacuating the forming chamber; (c) infiltrating the forming chamber with liquid-phase metal; (d) allowing the liquid-phase metal to solidify around the insulating substrate; and (e) forming at least one groove in the solidified metal, the groove extending downwardly toward the exterior surface of the insulating substrate so as to electrically isolate at least one region on the surface of the composite structure from other regions. In a preferred embodiment, the insulating substrate is constructed from aluminum nitride, and the metal matrix is an aluminum alloy.

In a second embodiment of the present invention, there is provided a method of fabricating a metal matrix composite containing electrically isolated areas, the method comprises: (a) placing a porous preform in a forming chamber; (b) placing an insulating substrate on said porous preform; (b) evacuating the forming chamber; (c) infiltrating the forming chamber with liquid-phase metal; (d) allowing the liquid-phase metal to solidify and form a metal matrix composite around and through said porous preform and insulating substrate; and (e) forming at least one groove in the solidified metal, the groove extending downwardly to the insulating substrate so as to electrically isolate at least one region on the surface. In an alternate embodiment, a second porous preform is provided on said insulating substrate.

Another aspect of the present invention is a metal matrix composite product possessing areas that are electrically isolated from one another. In a preferred embodiment, the product also possesses areas of intentionally unreinforced metal. In the preferred embodiment of the invention, the insulating substrate is constructed from aluminum nitride, the porous preform is SiC and the metal matrix is an aluminum alloy. In a most preferred embodiment of the invention, the metal matrix composite, the reinforced sections and the unreinforced sections are formed in a single vacuum die cast operation.

BRIEF DESCRIPTION OF THE DRAWINGS

Other features of the present invention will be further described in the following related description of the preferred embodiment which is to be considered together with the accompanying drawings wherein like figures refer to like parts and further wherein.

Figure 1:
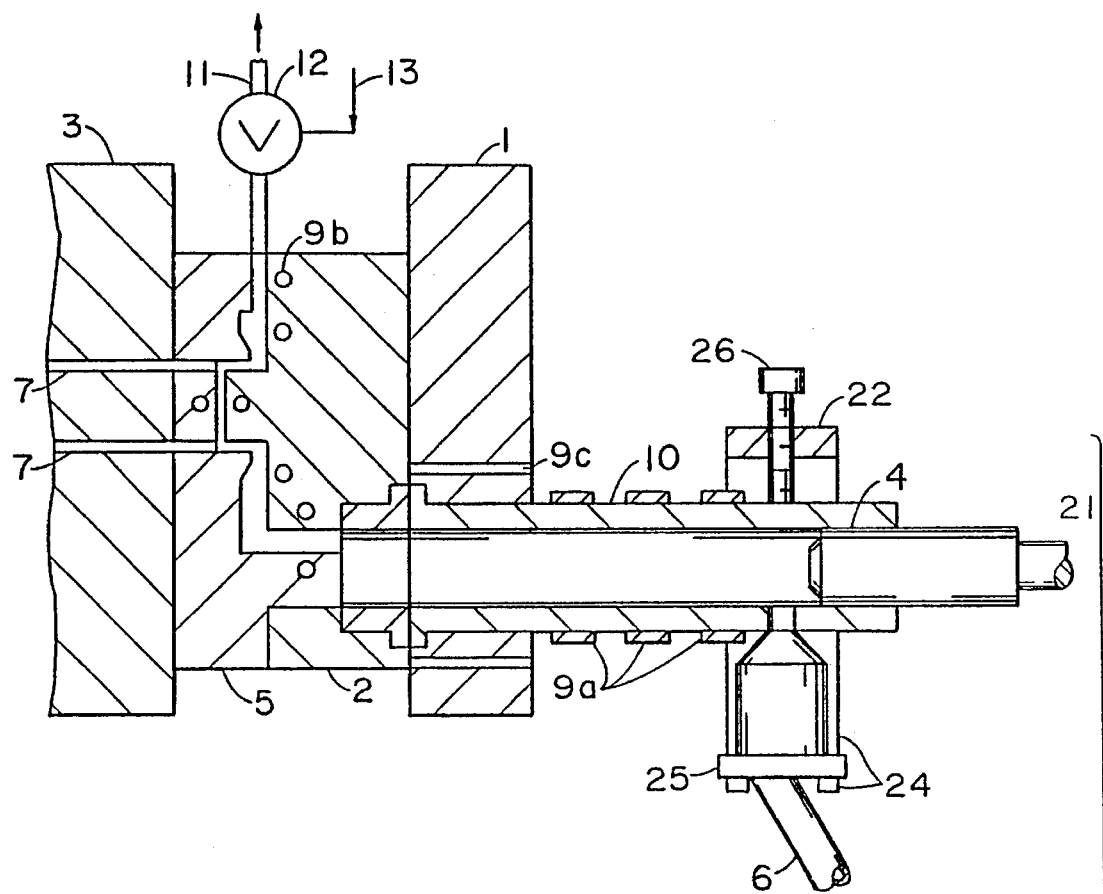
FIG. 1 illustrates a side view, partially in cross section, of a die-casting machine for use in carrying out the invention.
Figure 1A:
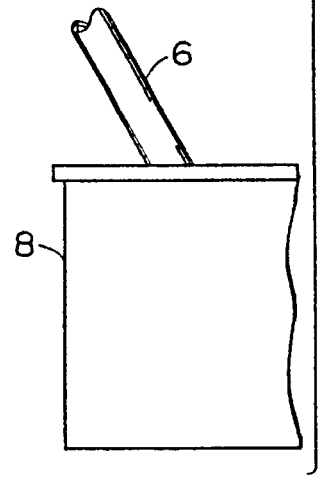
FIG. 1a corresponds to a part of FIG. 1 and shows an alternative metal input system.
Figure 1A:
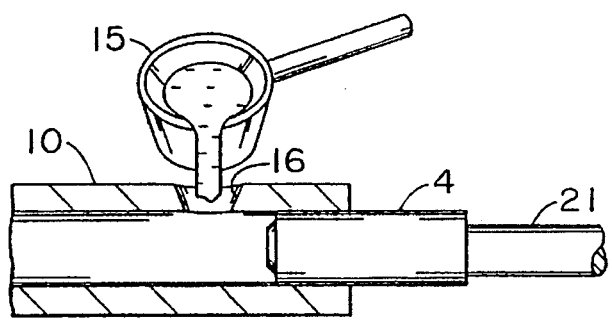

In the drawings, for convenience of illustration, the thicknesses and depths of the several layers, coatings and regions are neither shown to scale nor shown exactly in accordance with their relative proportions.

DEFINITIONS

The term "complex part" is used herein to mean a part having at least one protrusion, such as a wall, web or fin (which may be a plate fin or a pin fin) which extends from the body of the part in any direction at least a distance equal to twice the thickness of the protrusion.

The term "high volume fraction" is used herein to mean a volume fraction greater than 30 vol. % and preferably greater than 45 vol. % and most preferably 50–80 vol. %.

The terms "thin-walled" and "thin-walled section" are used herein to describe a part having a section, such as a wall, web or fin (which for example may be a plate fin or a pin fin) whose thickness is $\leq -0.1$ inch, preferably $\leq -0.05$ inch, and even $\leq 0.03$ inch.

The term "reinforcement material" is used herein to refer to ceramic, metal, cement and polymer having a form in the shape of fibers, whiskers, filaments, particles, ribbon, wire flake, crystals and platelets. Alternatively, the reinforcement material may be a porous preform formed from reinforcement material.

The phrases "preform", "porous preform" or "permeable perform" are used herein to mean a porous filler material which is manufactured with at least one surface boundary which essentially defines a boundary for infiltrating liquid-phase metal. The preform retains sufficient shape integrity and strength to provide dimensional integrity prior to being infiltrated by the liquid-phase metal. The preform is sufficiently porous to accommodate infiltration by the liquid-phase metal. A preform typically comprises a bonded array or arrangement of filler, either homogenous or heterogeneous, and may be comprised of any suitable reinforcement material, i.e., ceramic or metal particulates, powders, fibers, whiskers, etc., and any combination thereof. A preform may exist either singularly or as an assemblage of two or more separable parts. If separable preforms are used, they need not interlock mechanically or otherwise.

The terms "uni-cast" and "single cast" are used synonymously herein to refer to metal matrix composites that are formed by a single metal infiltration operation which forms a monolithic matrix body. The monolithic structure means that there is no joint in the structure which might otherwise interfere with heat flow.

The term "unreinforced metal" is used herein to refer to metals and alloys containing less than 5 vol. % of non-metallic added reinforcement materials and preferably less than 1 vol. %. Examples of unreinforced metals include aluminum, titanium, magnesium, iron, copper, zinc and alloys in which at least one of these metals is the largest single component.

The terms "reinforced metal" and "reinforced alloy" are used interchangeably herein to refer to metals and alloys containing more than 5 vol. % of reinforcement materials. The term is not intended to include metals which contain only intermetallics.

The terms "metal matrix composite" or the initials "MMC" are used herein to mean a material comprising a two- or three-dimensionally interconnected alloy or metal matrix which has embedded therein reinforcement materials. The metal matrix may be formed by infiltrating unreinforced metal into a preform and/or a mass of reinforcement or filler material and then solidifying the metal. The MMC may have areas that are intentionally formed without reinforcement materials. Alternatively, the metal matrix may be formed by infiltrating molten metal containing reinforcement material into a preform or mass of aggregate. In this embodiment, the reinforcement has a dual source. The MMC of this second embodiment may have areas that are intentionally formed with only one source of reinforcement materials, i.e., from the molten metal.

The term "electrical insulator" as used herein is intended to mean a low dielectric material such as glass, ceramic or plastic. A typical ceramic electrical insulator is aluminum nitride.

The terms "liquid-phase metal" and "molten metal" are used interchangeably herein to describe all fluid and semi-fluid phases in which the metal is not completely solidified. The terms include metal slurry and semi-solid phases and liquid metal containing undissolved ceramic particles.

MODE FOR CARRYING OUT THE INVENTION

Liquid-phase fabrication methods are particularly suited for the production of metal matrix composites. Liquid-phase metal is infiltrated into and surrounds a porous preform. The metal is then cooled or allowed to cool to form a reinforced mass of continuous metal. Metals are electrically conductive, and since the metal matrix is continuous, MMCs are normally not used in applications where there is a need to have one section of the metal matrix electrically isolated from another section of the matrix. Surprisingly, it has been found that MMCs can be fabricated with areas that are electrically isolated from one another.

The die casting machinery which is used in the present invention comprises the die casting machine itself, dies and vacuum equipment such as that shown in U.S. Pat. No. 5,259,436 and the references cited therein.

The machine typically includes a fill chamber into which a measured amount of molten metal is collected and a driven piston for moving the measured metal to the die. The piston drive causes the piston to employ a moderate infiltration pressure (usually less than 10,000 psi) on the metal. Die halves are mounted on fixed and movable platens. The die may be multi-cavity in order to produce several products substantially simultaneously at once.

Vacuum equipment is connected for evacuating the die cavity and the fill chamber in order to remove gas that could otherwise cause porosity in the MMC. The resulting reduction in the presence of oxygen caused by air removal is particularly advantageous in the case of MMCs having matrix and/or aggregate components whose oxidation can lead to decreased properties. Removal of the gas and the reaction of the vacuum is also advantageous in the filling of the die cavity and infiltration.

Prior to casting, the die cavity, fill chamber and piston may receive treatments for lubrication, casting release, etc.

The electrical insulator of an MMC may be provided by placing in the die cavity a substrate formed from an electrical insulator. The substrate is placed either on aggregate or a section of preform. Additional aggregate may be placed on the top surface of the electrical insulator. Alternatively, an additional preform or one or more preforms may be placed on top of the electrical insulator.

In addition to particles, other physical shapes such as fibers, whiskers or filaments may be used for aggregate for forming the preform. The aggregate may be coated with materials affecting the surface properties of the aggregate. Filaments may be provided in a variety of ways, including numbers of filaments in twisted or untwisted yarns, high bulk filament yarns, etc. Fibers may be woven, braided, knit, unidirectional or randomly oriented. The article entitled "Preform Fiber Architecture for Ceramic-Matrix Composites" by Frank K. Ko, in the American Ceramic Society Bulletin, February 1989, (Vol. 68, No. 2), pages 401–414, incorporated herein by reference, explains these and other possibilities for provision of aggregate of various kinds of materials. Examples of materials for the aggregate include, in addition to the SiC of the examples below, carbon, graphite, silicon nitride, boron, boron/tungsten, boron carbide/tungsten, boron nitride, beryllium, fused silica, mullite, glass, borosilicate, and oxides, nitrides, carbides, and borides such as zirconia, boron carbide, silicon carbonitride alumina and aluminum silicate (mullite) and combinations thereof.

Preforms are formed porous bodies constituted by pieces of aggregate bonded together by a suitable binder which is needed to provide green strength. The binder may be an organic material, in which case it is preferred to heat treat the preform prior to placing it into the die cavity; the heat treatment volatilizes the organic material to remove it from the preform and bonds the pieces of aggregate together. In order not to close the pores, which must later receive metal matrix, a partial bond is preferred. The binder may also be an inorganic material, such as sodium silicate, where the presence of residues is not harmful to the end use of the MMC product. Binderless preforms may also be used where the aggregate is bonded together by a mechanical interlocking of the individual aggregate pieces. See the article entitled "Highly Ceramic Loaded Net Shape Metal Matrix Composites" by T. B. Shaffer et al., SAE Technical Paper No. 910832, Society of Automotive Engineers, Warrendale, Pa. Finally, the preform may be bonded by sintering treatment.

The metal input system includes the equipment and procedure for introducing metal into the fill chamber of the die casting machine, followed by driving the metal charge from the fill chamber by the piston moving within the chamber. The molten metal moves from the fill chamber and is gated into the die cavity to infiltrate the aggregate.

Three exemplary metal input systems are the pour system, the suction system and the pressure transfer system. In the pour system, a desired amount of molten metal is poured through an opening in the top of the fill chamber whereupon the piston moves forward to block the opening to permit the vacuum system to evacuate the die and fill chamber. In the suction system, pressure below atmospheric is used to draw molten metal into the fill chamber. In the pressure transfer system, a pressure differential is used to push the molten metal into the fill chamber.

Aluminum alloys are a preferred material for the matrix, and examples of such alloys are included in the Example below. However, other matrix materials may be used, examples being essentially pure aluminum and magnesium, magnesium alloys, zinc and zinc alloys, etc. Metals for use in the invention may have melting or liquidus temperatures less than 1000° C. (1832° F.), 900° C. (1652° F.) or 800° C. (1472° F.). Depending on, for instance, materials of construction for dies and fill chamber, other metals may be titanium, copper, tin, nickel, iron, lead, cobalt and alloys thereof.

Heating means are provided in the fill chamber and in the dies to assure that the molten metal does not solidify until the reinforcing aggregate has been substantially completely infiltrated. Following completion of infiltration, a rapid solidification is advantageous to attain the desirable metallurgical properties of the matrix and, in cases where such has a tendency to happen, to prevent molten metal reaction with, or dissolution of, aggregate. It is also desirable that solidification be directional, proceeding along a front toward the molten metal source, in order to produce the least possible amount of solidification shrinkage. These needs, to get substantially complete infiltration followed by rapid and deskably directional solidification, require a balancing or timed control of temperature conditions. It can be of benefit to allow some interaction between molten matrix and aggregate in order to improve interfacial bonding, so there may be a limit on just how rapid solidification should be. However, a particular advantage of the vacuum-assisted pressure die casting process of the present invention is that it provides the ability to combine rapid infiltration and solidification to minimize or eliminate potentially deleterious reactions between the molten metal and the aggregate or reinforcement.

A special advantage of the invention has been found to lie in its ability to achieve substantially porosity-free MMCs containing a high volume fraction of aggregate, particularly volume fractions of 65 vol. % and above, for instance up to 80 vol. %, and even 85 vol. % and above. This is achieved according to the invention by loading the die cavities of vacuum die casting machines with aggregate preforms made, for instance, of particles having distribution of sizes, in order to obtain the interstitial filling needed for high volume fractions. If the preforms are thermally treated for strength and removal of an organic binder, care must be taken not to create excessive amounts of closed voids because otherwise the matrix infiltration would be blocked, and the resulting MMC product would not be substantially pore-free. In being careful, however, not to carry the bonding too far, the preform inherently achieved is not as strong as it could otherwise be. This means that infiltration velocity must be controlled so as not to erode the preform. It has been discovered that the lower pressures of die casting, as compared to those used in squeeze casting, coupled with the prior evacuation used in the vacuum die casting process and control of metal velocity, result in a proper balance of conditions, such that, without damaging highly loaded preforms, high volume fraction aggregate MMC of adequate strength can be achieved.

Thus, distinctive features of MMC products of the invention include an substantially pore-free product with a high aggregate loading at near net shape. Complex configurations characterized by thin (less than 0.1 inch, down to 0.050 inch and even to 0.030 inch and less) walls and highly angled mating surfaces can be produced owing to the unique characteristics of the process, notably the use of vacuum, which lowers infiltration pressures while maintaining the ability to fully penetrate preforms with high aggregate loading. Thus, the advantage of employing vacuum die casting over conventional die or squeeze casting is characterized by the ability to produce a substantially pore-free MMC with high aggregate loading in complex configurations. These other conventional processes suffer in their inability to produce either substantially pore-free material or complex configurations.

In the context of materials for electronic packaging, the present invention makes possible, for instance, the manufacture of aluminum matrix MMCs having high thermal conductivity coupled with coefficient of thermal expansion (CTE) values considerably less than that of aluminum. The ability of the invention to manufacture complex MMC shapes makes possible, for instance, production of an integrated thermal management system for electronic packaging. This system includes, for instance, a monolithically combined heat exchanger and electronic package lid.

A surface layer of aggregate-free matrix material may be provided on the MMC products of the invention during the vacuum die casting to facilitate the processes.

An additional advantage of the aluminum matrix MMCs of the invention is that the aluminum surfaces may be anodized for corrosion protection and for selective identification and placement of electrically insulated areas.

PROCESS AND EQUIPMENT

Referring to FIG. 1, this Figure shows a modified cold chamber, horizontal vacuum die casting machine, including essentially only the region of the fixed clamping plate 1, or platen, with the fixed die, or mold half 2 and the movable clamping plate 3, or platen, with the movable die, or mold half 5 of the die casting machine, together with the piston 4, suction tube 6 for molten metal supply, holding furnace 8 and fill chamber 10. The suction tube 6 is connected to the fill chamber 10 by means of a clamp 22. Clamp 22 has a lower hook-shaped, forked tongue 24 which passes underneath an annular flange 25 on the suction tube 6. From the top, a screw 26 is threaded through the clamp 22. This enables a clamping of the end of suction tube 6 to the inlet orifice of fill chamber 10. Ejector pins (not shown) may be provided through passageways 7 to provide means for removing the cast product when the die halves are opened following solidification of the molten metal matrix.

The vacuum line 11, for evacuating the die chamber by removing air and other gases in the direction of the arrow, is connected to the die in the area where the die is last filled by incoming molten metal. Line 11 is opened and shut using valve 12, which may be operated via control line 13 by control equipment (not shown).

Drive means (not shown) is provided to push the piston via the drive rod 21 to develop a metal injection pressure. While pressure will usually be in the range 5,000 to 10,000 psi, a machine able to deliver up to 16,000 psi is preferred in order to provide an ability to handle parts which may require higher pressures.

Strip heaters 9a on the fill chambers and heating elements 9b and 9c, in the form of heater tube cartridges, in the die halves and platens prevent premature solidification of the molten matrix material, before complete infiltration of the aggregate. Induction heaters and other devices may also be used to prevent premature solidification. In the case of aluminum alloy containing 10 wt. % silicon with a liquidus temperature of 585° C. (1085° F.), solidus of 575° C. (1067° F.), the walls of the die cavity and the fill chamber are controlled for instance to 250° C. (482° F.) for this purpose, in a case where input temperature of the molten metal into the fill chamber is 700° C. (1292° F.). This temperature of 250° C. (482° F.) is below the solidus of this alloy, but it is an example of a temperature which retards heat loss so that infiltration can be completed, with solidification nevertheless occurring soon thereafter. Higher die temperatures can be used to further enhance infiltration. However, higher die temperatures can increase solidification time.

The piston head may be cooled internally in order, for instance, to prevent it from becoming stuck inside the fill chamber due to thermal expansion and also to extract heat from the biscuit of matrix alloy left at the end of the fill chamber beyond the extent of the forward stroke of the piston after the piston has been driven to the die cavity and infiltration has been completed.

The vacuum die caster of FIG. 1 uses vacuum to achieve charging of the fill chamber 10 through suction tube 6. This type of operation is more fully described in International Publication No. WO 90/10516, incorporated herein by reference. FIG. 1 a shows the metal pour charging technique used in the Example described below. In this technique, ladle 15 is used to pour molten aluminum through a charging orifice 16 in the top of the fill chamber while the piston is in the retracted position.

PRODUCTS

Figure 2:
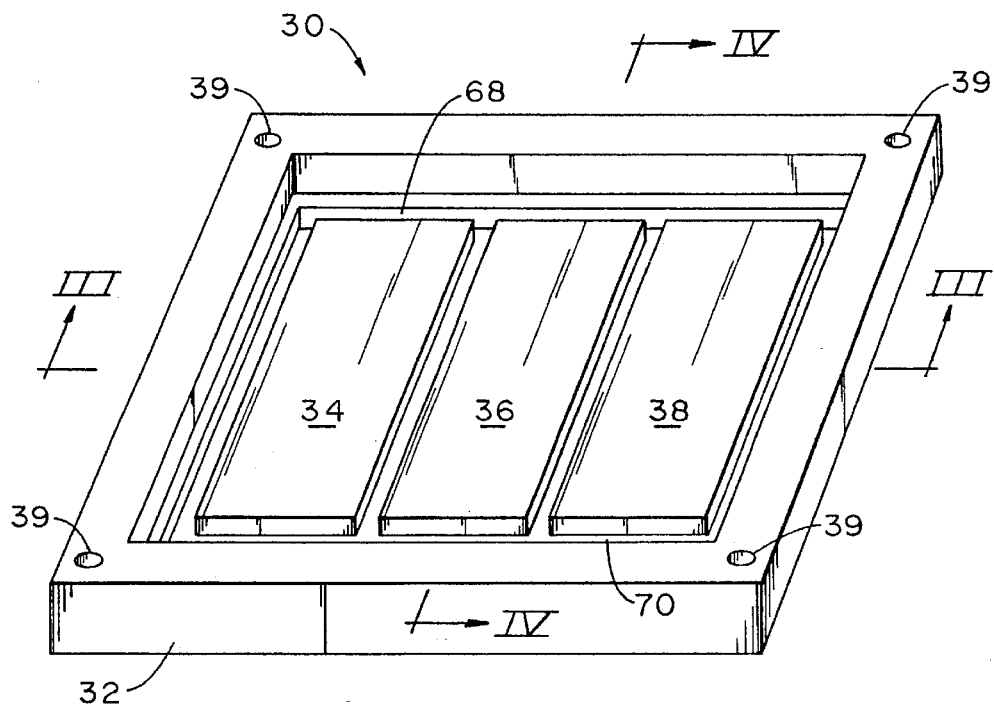
FIG. 2 is a perspective view of the metal matrix composite of the present invention.

Referring to FIG. 2, there is illustrated a perspective view of a preferred MMC product 30 of the present invention. It is to be noted that the invention is not limited to the preferred embodiment or alternate preferred embodiment hereinafter described.

Product 30 has a base plate 32 with three integrally formed modules 34, 36 and 38 which are electrically isolated from each other and from base plate 32. Product 30 is formed in a single casting operation and has several layers formed from different materials. Holes 39 in each of the corners of base plate 32 facilitate the mounting of product 30 to a larger component.

Figure 3:
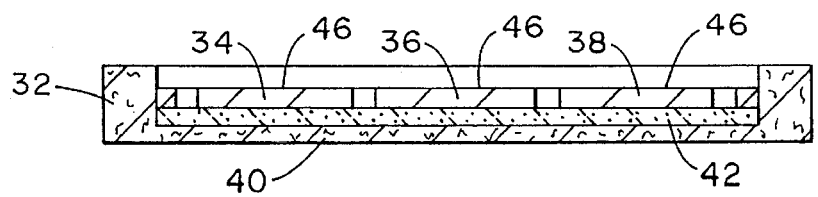
FIG. 3 is a sectional view taken along line III—III of FIG. 2.
Figure 4:
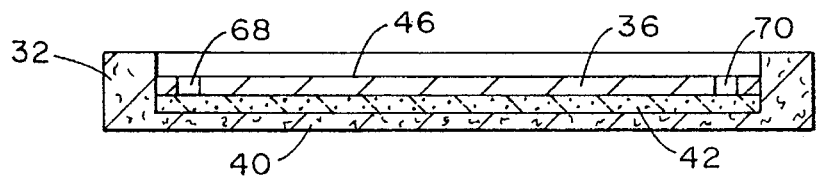
FIG. 4 is a sectional view taken along line IV—IV of FIG. 2.

As seen in FIGS. 3 and 4, base plate 32 is formed from reinforced metal layer 40 with an electrical insulator 42 disposed thereon. The reinforced metal layer 40 contains aggregate material of the type discussed above. A preferred reinforcement material is silicon carbide.

Electrical insulator 42 is ceramic. A preferred material for use as electrical insulator 42 is aluminum nitride or boron nitride or aluminum oxide. Electrical insulator 42 is shown as a single layer extending across the upper surface of reinforced metal layer 40. However, insulator 42 need not be a single piece. As will become clear from the description below, insulator 42 need only be continuous in the respective exposed areas. Breaks or edges that are not exposed do not interfere with the ability of the insulator to electrically isolate areas of product 30. In addition, insulator 42 need not extend across the entire upper surface of reinforced metal layer 40. Insulator 42 may be formed from two or more pieces (not shown), each covering an area larger than the modules which are to be electrically isolated. In a preferred embodiment, insulator layer 42 has a porous surface layer (not shown). The porous surface further improves bonding of the insulator to the infiltrated metal.

Modules 34, 36 and 38 are formed from unreinforced metal layer 46. Since in service the modules 34, 36 and 38 contact only electrical insulator layer 42 of base plate 32, the modules are electrically isolated from the common base plate 32 and from each other.

As will be described in greater detail below, product 30 is formed by infiltrating unreinforced molten metal into a chamber containing a unit comprising porous preforms and the essentially non-porous electrical insulator 42. A preferred molten metal is aluminum or an aluminum alloy. The molten metal fills the porous preform to form reinforced metal layer 40 about electrical insulator 42. Unreinforced metal layer 46 is preferably formed in a space inside the chamber that does not contain preform or aggregate material. Therefore, reinforced metal layer 40 and unreinforced metal layer 46 are all formed from the same unreinforced alloy in the same die operation. Electrical insulator 42 is essentially unchanged during infiltration except that it is surrounded by solidified metal.

Turning next to FIGS. 5a-5d, they illustrate the steps involved in fabricating an alternate preferred MMC. The product of FIG. 5 differs from that of FIG. 2 in that a second preform 54 is positioned on insulating layer 42. The shape of the product formed in FIGS. 5a-5d is the same as that shown in FIG. 2. FIGS. 5a-5d illustrate the steps involved in creating the stack of layers in the mold chamber, infiltrating the mold to form the MMC and finally electrically isolating the sections of the MMC.

Figure 5A:
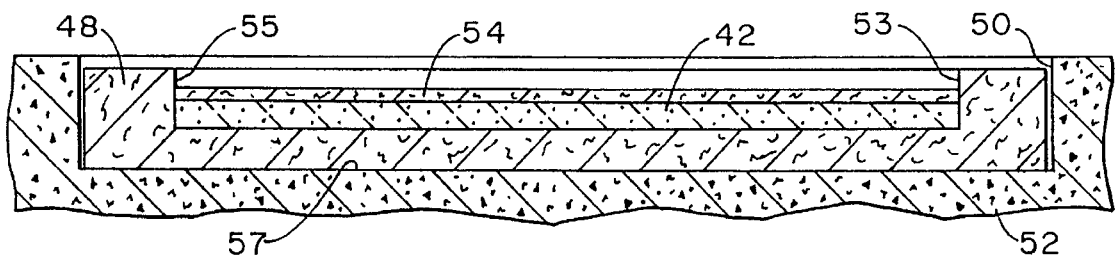
FIGS. 5a–5d are views illustrating the sequential processing steps involved in forming the MMC product of the present invention according to a preferred method of the invention.

Starting first with FIG. 5a, base preform 48 is placed into chamber 50 of a mold 52. Base preform 48 is approximately 0.5-inch thick, and when infiltrated, will form reinforced layer 32 of the module shown in FIGS. 2-4. Base preform 48 may have holes 39 or other passageways provided therein to accommodate mounting product 30 to a larger component. Alternatively, holes may be drilled in formed metal matrix composite product 30 to form holes 39 shown in FIG. 2.

Figure 5B:
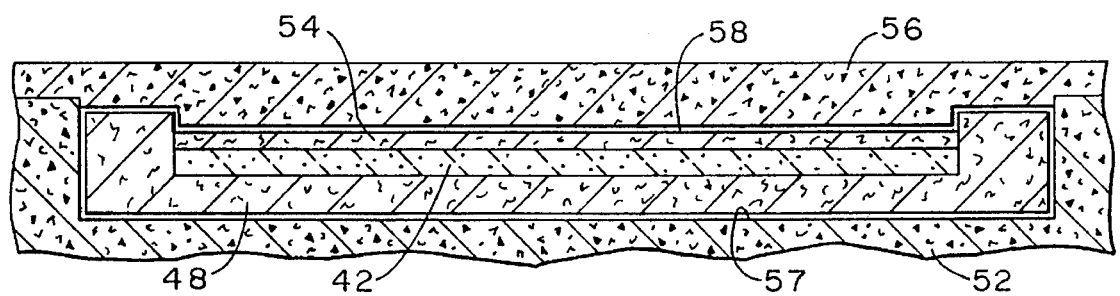

Although, base preform 48 is shown to rest on floor 57 of mold chamber 50 in FIG. 5a, it may be elevated if desired, as shown in FIG. 5b. If base preform 48 is elevated, molten metal will enter the space beneath base preform 48 and floor 57 of chamber 50 to form an unreinforced layer along the bottom of the module.

Electrical insulator 42 is placed directly on the upper surface of base preform 48. In the design shown in FIG. 5a, electrical insulator 42 is sized to fit between sidewalls 53 and 55 of preform 48. After infiltration with molten metal, electrical insulator 42 and base preform 48, together with the solidified metal, will form base plate 32 of the product shown in FIG. 2.

Module preform 54 is placed directly on top of electrical insulator 42. After infiltration and electrical isolation module preform 54 will form reinforced metal layer 44 of modules 34, 36 and 38, as shown in FIG. 5d. For the product design shown in FIG. 2, it is preferred that three separate module preforms are used—one for each module. The separate modules can be mechanically locked in place to prevent their lateral movement during infiltration. The use of separate preforms results in the need for less machining of the MMC to electrically isolate the sections 34, 36 and 38 of product 30.

In FIG. 5b, mold cap 56 is positioned over module preform 54. Mold cap 56 is intentionally formed so that space 58 remains between the top surface of module preform 54, the uncovered portions of electrical insulator 42 and base plate preform 48 and the lower surface of mold cap 56. Mechanical locking devices and/or spaces (not shown) may be used to prevent movement of the modules during infiltration.

Next, the chamber is evacuated, and unreinforced molten metal is infiltrated under pressure into mold chamber 50. The molten metal fills space 58 and fills the pores in preforms 48 and 54 to form MMC product 30. During infiltration, the reinforced layers 40 and 44 are formed in-situ with the near simultaneous bonding of the freshly formed reinforced layers to the surface of the electrical isolator. The in-situ formation of the MMC and the substantially simultaneous bonding of the freshly formed reinforced layers result in a substantially pore-free interface between reinforced layers 40 and 44 and electrical insulator 42. The pore-free interface is critical to achieving the desired thermal conductivity properties of product 30.

Figure 5C:
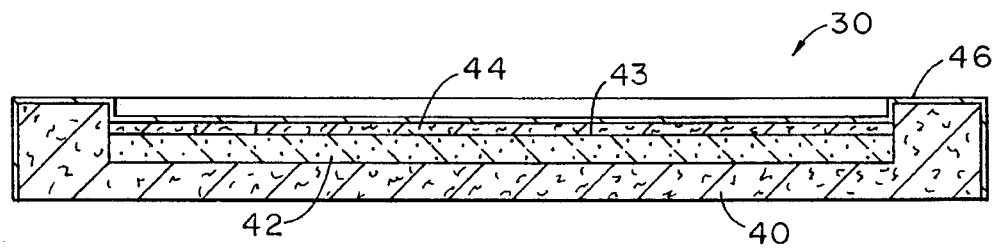
Figure 5D:
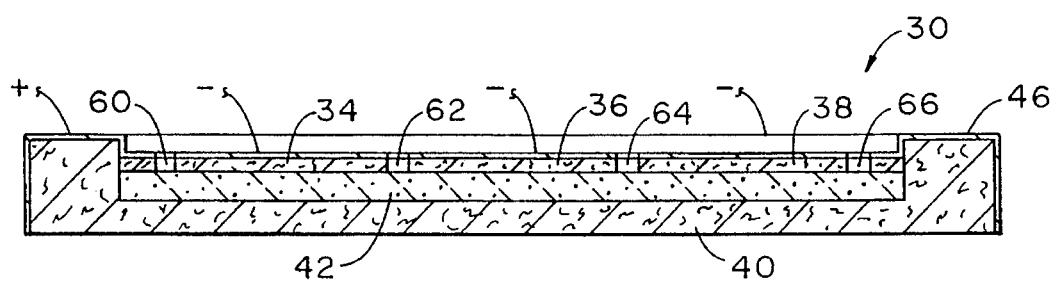

After the molten metal solidifies, the mold cap 56 is lifted and MMC product 30 is removed as a single unit from the mold 52 as shown in FIG. 5c. Modular preform 54 shown in FIG. 5b is now reinforced metal layer 44, and base plate preform 48 shown in FIG. 5b is now reinforced metal 40. As will become clear from the description below, electric insulator 42 and reinforced metal layer 44 and 40 form base plate 32 of FIG. 2. The area that defined space 58 in FIG. 5b prior to infiltration is now unreinforced metal layer 46. In this example, metal layer 46 extends across the entire upper surface of product 30. Since metal is a conductor of electricity, unreinforced metal layer 46 electrically connects the entire surface of the product 30. MMC product 30 of FIG. 5c is suitable for applications which do not require that sections of the product to be electrically isolated from one another.

In FIG. 5d, grooves 60, 62, 64 and 66 are formed through unreinforced layer 46 to insulator layer 42. After the formation of grooves, FIG. 5d is essentially the same as FIG. 3. Grooves 60, 62, 64 and 66 expose the top surface 43 of electrical insulator 42 and extend the length of product 30 (see FIG. 2) to form modules 34, 36 and 38. In the particular design shown in FIG. 2, all grooves 60, 62, 64 and 66 are all parallel. However, the grooves need not be parallel to one another.

Additional grooves, shown in FIG. 2 as 68 and 70, extend across the width of the inner portion of the product. FIGS. 4 illustrated that the grooves expose the top surface 43 of electrical insulator 42. The additional grooves intersect parallel grooves 60, 62, 64 and 66 to form a trench which completely surrounds modules 34, 36 and 38 and complete the electrical isolation of the modules.

The width of the grooves is not considered to be important to practicing the invention. They can be narrow grooves or wide trenches depending on the product design. The critical feature of the grooves is that they act together to electrically isolate areas 34, 36 and 38 from one another in the intended electrical application. It has been found that a groove width of 0.008 inch is adequate to isolate the modules in typical electrical applications.

Grooves may be formed by mechanical or chemical means. A diamond cutting wheel has been found to be a fast, cost effective means for cutting grooves in aluminum base alloys. In addition, an electrical discharge machine (EDM) and a laser, such as an excimer laser, can also be used to remove metal 46 and form a groove.

The chemical solution needed to etch the grooves will vary with the chemical composition of the alloy used in infiltration. If chemical solutions are used, the portions of the surface 46 that are not to be etched may need to be masked with a material that is substantially unaffected by the chemical solution. Such masking materials are well known to the electronics art.

Since surface 46 is an essentially flat area of an aluminum alloy, masks and etchants can also be used to provide complex circuit patterns on the surface of the isolated modules to electrically isolate section of each module from each other. Electronic devices and connectors can be attached to the circuit patterns to form functional electronic elements. The pore-free interface between reinforced layers 40 and 44 and electrical insulator 42 results in near theoretical transfer of heat from surfaces 68 and 70 to base 32.

FIG. 5d includes electrical leads connected to a power source (not shown) to place an electrical potential across insulator 42 and thus provide three electrical capacitors.

Turning next to FIGS. 6a–6d, they illustrate the steps involved in fabricating the MMC of FIG. 2 according to an alternate preferred form of the invention. FIGS. 6a–6d illustrate the steps involved in providing a mold containing an electrical isolator, infiltrating mold with particulate reinforced molten metal to form the discontinuously reinforced MMC and finally electrically isolating the sections of the MMC.

Figure 6A:
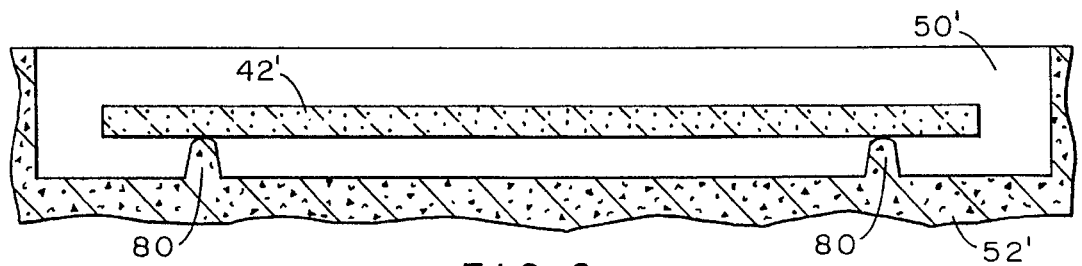
FIGS. 6a–6e are views illustrating the sequential processing steps involved in forming an alternate preferred form of the invention.

Starting first with FIG. 6a, electrical insulator 42' is placed into chamber 50' of a mold 52'. Electrical isolator 42' rests on supports 80 so that the bulk of the insulator 42' is elevated from the floor of mold 52'. After infiltration with molten metal, space 82 beneath electrical insulator 42' forms base plate 32' of the product shown in FIG. 2.

Figure 6B:
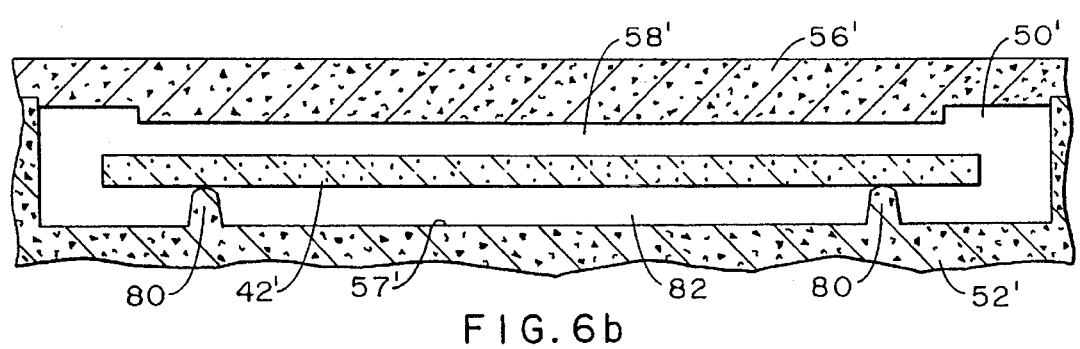

In FIG. 6b, mold cap 56' is positioned over module insulator 42'. Mold cap 56' is intentionally formed so that space 58' remains between the top surface of insulator 42' and the lower surface of mold cap 56'. Next, the chamber is evacuated, and reinforced molten metal is infiltrated under pressure into mold chamber 50'. The molten metal is preferably aluminum and the reinforcement material is preferably particulate silicon carbide.

The molten metal fills space 82 and 58' to form MMC product 30'. During infiltration, the reinforced metal surrounds electrical isolator 42'. The in-situ formation of the MMC from the reinforced metal and the substantially simultaneous bonding of the reinforced metal to electrical isolator 42' result in a pore-free interface between reinforced material and the electrical insulator. The pare-free interface is critical to achieving the desired thermal conductivity properties of product 30'.

Figure 6C:
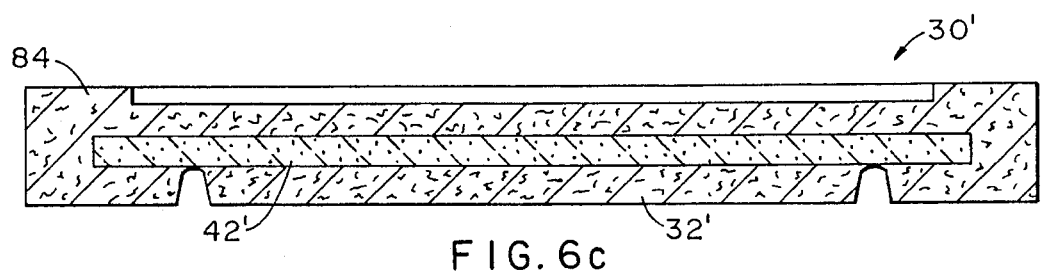

After the molten metal solidifies, the mold cap 56' is lifted and MMC product 30' is removed as a single unit from the mold 52' as shown in FIG. 6c. Space 58' and 82 (shown in FIG. 6b) are now reinforced metal 84. Since metal is a conductor of electricity, reinforced metal 84 electrically connects the entire surface of the product 30'. MMC product 30' of FIG. 6c is suitable for applications which do not require that sections of the product to be electrically isolated from one another.

Figure 6D:
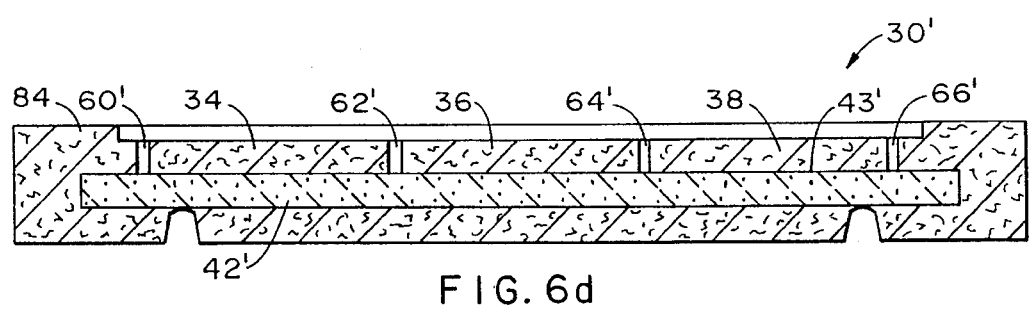

In FIG. 6d, grooves 60', 62', 64' and 66' are formed through reinforced metal 84 to insulator layer 42'. Grooves 60', 62', 64' and 66' expose the top surface 43' of electrical insulator 42' and extend the length of product 30 (see FIG. 2) to form areas 34, 36 and 38.

Figure 6E:
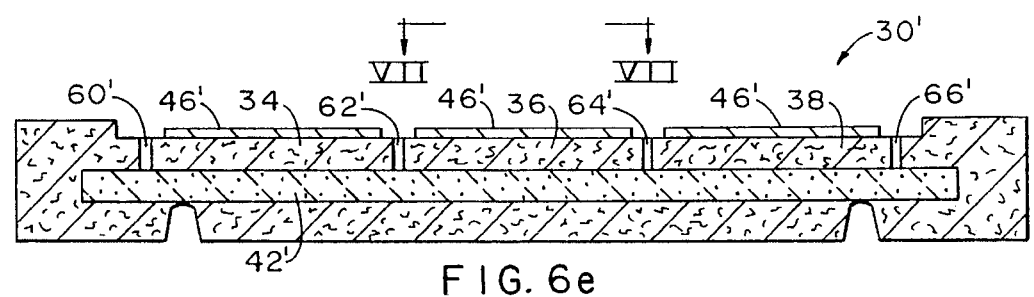

In FIG. 6e, areas 34, 36 and 38 are metallized with metal layer 46'. Since the metallization of the modules is subsequent to formation, metal layer 46' need not be the same alloy as the metal used in infiltration. Thus for example, if an aluminum alloy is used to form reinforced layer 84, metal layer 46' may be formed from a metal alloy such as copper, nickel, silver, gold or combinations thereof.

Metal layer 46' may be printed on the surface of insulator 42' by methods known in the electronics arts. These methods include applying a mask to the portions of insulator 42' which are not to be metallized and then metallizing the exposed surface and removing the mask without removing the applied metal layer.

Figure 7:
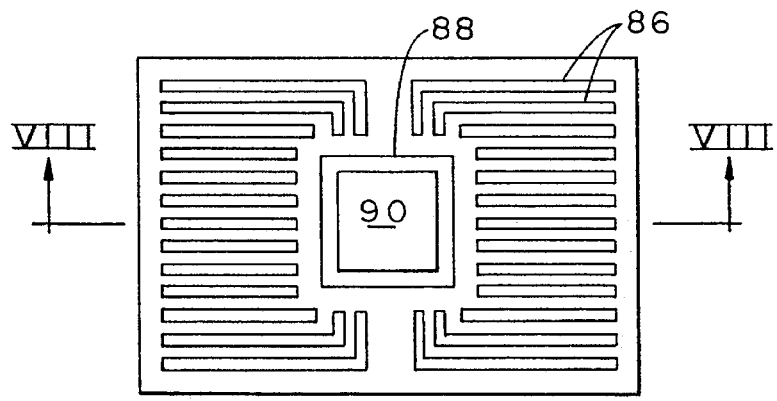
FIG. 7 is a plan view of section VII—VII of FIG. 6.

Turning next to FIG. 7, there is illustrated a plan view of a metallization pattern taken on line VII—VII of FIG. 6. Metal layer 46' forms conductive circuits 86 and pad 88. Pad 88 is for mounting an electronic device such as a semiconductor chip. Conductive circuits 86 are formed on insulator layer 42' into a comb-like shape to form a link in the electrical chain that connect the electronic device on pad 88 to another device. Conductive circuits 86 are electrically isolated from one another and pad 88.

Figure 8:
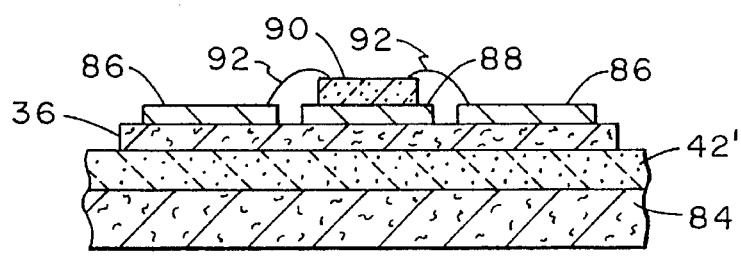
FIG. 8 is a cross sectional view of FIG. 7 taken along line VIII—VIII of FIG. 7.

FIG. 8 is a cross-sectional view of FIG. 7 taken along line VIII—VIII of FIG. 7 illustrating the placement of semiconductor chip 90 on pad 88. Wire bonds 92 electrically connect parts of semiconductor chip 90 to a conductive circuit. Conductive circuits 86 can then be electrically connected to other components via linking connectors such as guide pins, wires, lead frames and the like, all not shown.

Figure 9:
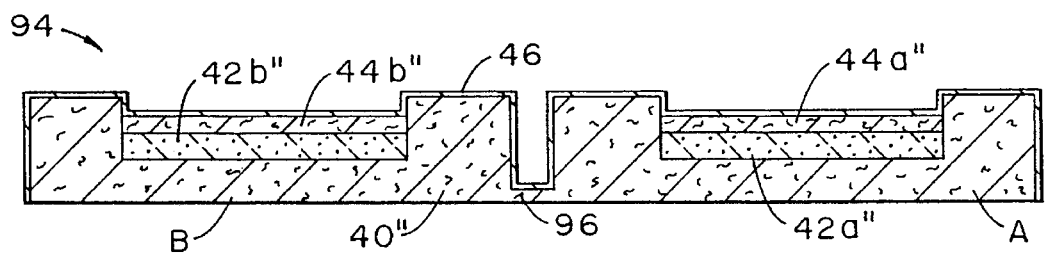
FIG. 9 is a cross sectional view of an alternate design for casting multiple products in a single cast.

FIG. 9 is a cross-sectional view of an alternate design for cast product 94 which is formed to be divided into multiple products. The product of FIG. 9 is similar to that shown in FIG. 5c, described above. A double prime (") is used in FIG. 9 to identify components of the product that are counterparts to the product shown in FIG. 5c.

Cast product 94 is formed in a single cast. Reinforced metal 40" has a narrow central portion 96 which may run the length of the cast product. Narrow central portion 96 provides a thin section to ease the division of case product into two independent sections (A and B) each having its own electrical insulator (42a" and 42b") and reinforced metal section (44a" and 44b"). Although the cast product is shown to have only one narrow central portion 96, it is contemplated that a design having a plurality of narrow sections may also be used. A plurality of narrow sections will permit the casting of 2, 3, 4 or more parts in a single casting operation. In addition, although the independent sections A and B are shown to be identical, they may be designed with different size and shape.

Figure 10:
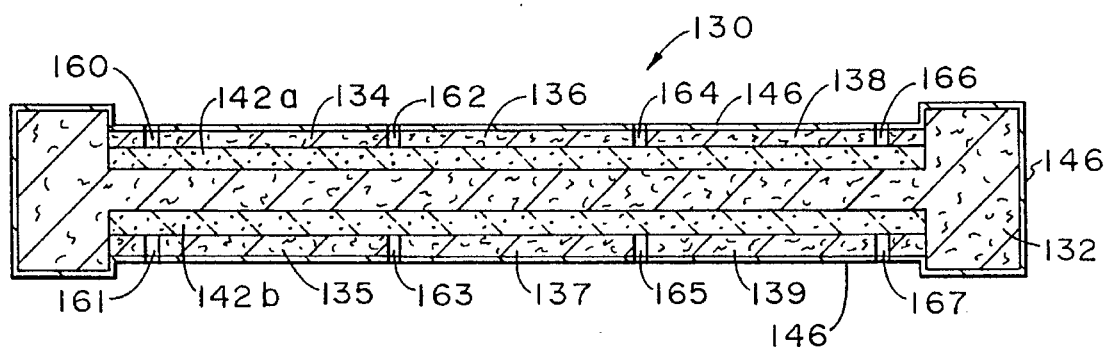
FIG. 10 is an alternate preferred embodiment of the invention in which electrically isolated metallization layers are formed on opposite sides of the product.

Turning next to FIG. 10, there is illustrated an alternate preferred embodiment of the invention. Product 130 is similar to that shown in FIGS. 2 and 3 and is formed in a single casting operation. However, product 130 has electrically isolated modules and metallization layer 146 formed on opposite sides of the product. Product 130 has integrally formed modules 134, 136 and 138 formed on one side and modules 135, 137 and 139 formed on the opposite side.

The method of forming product 130 is similar to that described above and illustrated in FIGS. 5a–5d. However, product 130 is formed using two electrical insulators 142a and 142b. Grooves 160, 162, 164 and 166 are formed through unreinforced layer 146 to insulator layer 142a to form modules 134, 136 and 138. Grooves 161, 163, 165 and 167 are formed through unreinforced layer 146 to insulator layer 142b to form modules 134, 136 and 138. Since the modules contact only electrical insulator layer 142a or 142b, the modules are electrically isolated from the common base plate 132 and from each other.

As with the product shown in FIG. 2, holes (shown only in FIG. 2) in each of the corners of base plate 132 facilitate the mounting of product to a larger component. Although cast product 132 is shown to have two separate insulator layers 142a and 142b, it is contemplated that a product (not shown) could be cast to create a product having modules on opposite sides that uses only one insulator layer. In such, as a two sided product, the insulation layer will be mechanically suspended in the mold by the preform forming base plate 132. In addition, it is contemplated that a cast product could be designed which includes the novel features of FIGS. 9 and 10. Such a product would have modules on opposite sides and have at least one narrow section for creating independent sections from the single cast.

The benefit of the present invention is illustrated in the following Example.

EXAMPLE

To test the invention, MMC material for potential electronic applications were manufactured. The goals for these applications are to produce material having a high thermal conductivity to remove heat generated by semiconductor devices and having multiple sections that are electrically isolated from one another. The product design was similar to that shown in FIG. 2.

Aluminum metal was selected as the infiltration material base. Aluminum and its alloys have thermal conductivity adequate for the present application. SiC was selected as the material for the preforms. The thermal conductivity of SiC can vary depending, for instance, on purity. Purity may affect thermal conductivity principally by way of interfacial effects in an MMC, rather than by changes in the bulk thermal conductivity of the SiC. In any event, combinations of aluminum matrix and different grades of SiC permit considerable latitude in achieving high thermal conductivity. The SiC used was manufactured by Lonza, Inc. located in Fairlawn, N.J.

Aluminum nitride (AlN) was selected as the electrical isolator material since it does not react with metal at processing temperature. AlN also has a thermal expansion coefficient that can be matched or approximated by an aluminum matrix reinforced with SiC. In addition, AlN has a high thermal conductivity and a low electrical conductivity and a moderately low dielectric constant and loss. The AlN isolator was approximately 0.025-inch thick.

The stack of preform and isolator were packed in a graphite mold, and the assembly was heated to approximately 720° C. (1328° F.) in an electric furnace and held for more than 15 minutes. The heated mold was then quickly transferred to a vacuum die casting die cavity which had been preheated to 250° C. The cavity holding the mold was then evacuated to remove air inside the mold and the preforms.

Upon completion of the evacuation, molten metal was introduced to the cavity and was pressurized to infiltrate into the SiC layers inside the mold. The reinforced metal layers were formed in-situ with the near simultaneous bonding of the reinforced metal layers to the isolator.

After the molten metal solidified, the assembly was removed from the mold. To electrically isolate the modules from one another and the base plate, the metal at the edges of the modules was removed by providing grooves across the entire width of the module using a diamond cutting wheel.

The resulting product was tested, and it was determined that the product met the application requirements. In particular, the product exhibited a sufficiently high thermal conductivity, and the modules were electrically isolated from one another. With regard to the thermal conductivity of the product, the interfacial bond between the electrical isolator and the reinforced layers was essentially pore free. A low porosity at these interfaces, due in part to the vacuum used in die casting, was key to obtaining the desired thermal conductivity.

The resulting MMC would find use as a substrate for electronic devices and connectors requiring sections that are electrically isolated from one another.

Whereas the preferred embodiments of the present invention have been described above in terms of being especially valuable in forming MMCs having an aluminum alloy matrix, it will be apparent to those skilled in the art that the present invention will also be valuable in MMCs from other metals. Metals suitable for use with the present invention are not limited to aluminum and aluminum alloys. MMCs formed from other metals such as magnesium, copper, iron, zinc, nickel, cobalt, titanium, beryllium, tungsten, gold, silver and alloys thereof may also benefit from the present invention.

Whereas the preferred embodiments of the present invention have been described above in terms of being especially valuable in forming MMCs utilizing SiC as the reinforcement phase, it will be apparent to those skilled in the art that other reinforcement material can also be used. It is contemplated that other reinforcement material known in the art may also be used. Specifically, titanium carbide, boron carbide, graphite, carbon, alumina, silicon nitride, aluminum nitride, mullite, titanium boride, zirconium boride, silicon aluminum oxynitride (SiAlON), and combinations thereof can be used as reinforcement materials.

Whereas the preferred embodiments of the present invention have been described above in terms of being especially valuable in an MMC using preforms which retain sufficient shape integrity and strength to provide dimensional fidelity prior to being infiltrated by the liquid-phase metal so that it can be placed into a mold, it will be apparent to those skilled in the art that the present invention is not so limited. Loose reinforcement material may be packed into the mold to create a reinforcement material to be used in forming the base plate. The electrical conductor can then be placed on the loosely packed material.

Although the invention has been described in terms of an aluminum nitride insulator, it is not intended to be so limited. Other known ceramic insulators including but not limited to boron nitride can also be used in practicing the invention.

Whereas the preferred embodiments of the present invention have been described in terms of allowing the liquid-phase metal to solidify, it will be apparent to those skilled in the art that the invention is not so limited. It is contemplated that the solidification of the liquid-phase metal may be accelerated by cooling techniques, which include circulating cool air over the surface of the mold and/or formed product. The word "cool" is intended to be relational to the solidifying metal. In this regard, cool air has a temperature that is lower than the temperature of the solidifying metal. Cool air may be considerably warmer than normal ambient temperature (68° F.).

In addition, it is also contemplated that the time required for the liquid-phase metal to solidify may be lengthened by preheating the molds to a temperature which is higher than necessary to successfully preform the process. Increasing the temperature of the preforms will lengthen the time required to cool the preforms to room temperature and lengthen the time the product remains at an elevated temperature.

It is also contemplated that the formed metal matrix product may be heated or reheated to a temperature sufficient to cause recrystallization and/or recrystallization in the metal phase. The time and temperature used in post-forming heating processes can have a profound effect on the amount of grain growth and the size of the resulting grains.

Whereas the invention has been described in terms of the use of a die casting machine which applies a vacuum to the mold chamber to assist infiltration, the invention is not so limited. It is also contemplated that the metal can be infiltrated from one end of the die cavity to produce a moving front of liquid phase metal which sweeps gas contained in the pores of the preform from one end of the mold to the other end of the mold without entrapping gas in the form of pores within the preform. It is further contemplated that wetting agents, such as for example $TiB_2$, can be formed on the surfaces of the preform and/or insulating material to increase the wettability of the molten metal to the porous preform and reduce the probability of entrapping gas in the preforms.

Whereas the invention has been described in terms of the use of separately heated dies, it is not intended that the invention is so limited. The dies can be permanently attached to the die casting equipment and the preform heated separately or in-situ.

Whereas the invention has been described in terms of placing individual preforms and insulators into the die separately, it is not intended that the invention is so limited. It will be apparent to those skilled in the art that the preforms and insulators may be sintered, bonded or otherwise joined together into a unit prior to placement in the mold chamber. Joining the individual pans into a unit facilitates handling and reduces the time needed to set up the mold prior to infiltration.

What is believed to be the best mode of the invention has been described above. However, it will be apparent to those skilled in the art that numerous variations of the type described could be made to the present invention without departing from the spirit of the invention. The scope of the present invention is defined by the broad general meaning of the terms in which the claims are expressed.

What is claimed is:

1. A method of fabricating a metal matrix composite comprising the steps of:
    (a) placing at least one electrically insulating substrate on at least one porous preform in a forming chamber;
    (b) evacuating said forming chamber;
    (c) introducing liquid phase metal into said forming chamber and infiltrating said at least one porous preform and covering a surface of said at least one electrically insulating substrate with said liquid-phase metal;
    (d) solidifying said liquid-phase metal, thereby forming a composite comprising said at least one porous preform, said at least one electrically insulating substrate and a metal layer said metal layer covering said surface of said at least one electrically insulating substrate; and
    (e) electrically isolating at least one region of said metal layer from another region of said metal layer by removing at least a portion of said metal layer therebetween.

2. The method of claim 1 in which said at least one insulating substrate is aluminum nitride.

3. The method of claim 1 in which said liquid-phase metal is an unreinforced metal and said metal layer is a layer of unreinforced metal.

4. The method of claim 1 in which said liquid-phase metal is a reinforced metal and said metal layer is a layer of reinforced metal.

5. The method of claim 1 in which said liquid-phase metal contains unconsolidated ceramic particles having a particle size of less than 50 microns.

6. The method of claim 1 in which said liquid-phase metal is an aluminum alloy containing unconsolidated ceramic particles.

7. The method of claim 1 in which said liquid-phase metal contains unconsolidated ceramic particles selected from the group consisting of alumina, carbon, graphite, silicon carbide, boron carbide, silicon nitride, aluminum nitride, mullite, titanium boride, zirconium boride, silicon aluminum oxynitride (SiAlON) and combinations thereof.

8. The method of claim 1 in which said liquid-phase metal is an aluminum alloy containing 5–55 vol. % silicon carbide particles.

9. The method of claim 1 in which step (e) includes applying a mask to selected portions of said metal layer and etching the portions of said metal layer that are not covered with said mask.

10. The method of claim 1 in which step (e) includes mechanically removing said metal, thereby forming a groove in the surface of said metal layer.

11. The method of claim 1 in which step (e) includes using a laser, thereby forming a groove in the surface of said metal layer.

12. The method of claim 1 in which step (e) includes using an electro discharge machine, thereby forming a groove in the surface of said metal layer.

13. The method of claim 1 in which step (e) includes:
    forming a closed continuous groove through said metal layer which electrically isolates said at least one region from said another region.

14. The method of claim 1 in which step (e) includes:
    forming at least two continuous grooves through said metal layer which electrically isolates three regions of said metal layer from each other.

15. The method of claim 1 in which said liquid-phase metal is a copper alloy containing unconsolidated ceramic particles.

16. The method of claim 1 in which said liquid-phase metal is a copper alloy containing 5–55 vol. % silicon carbide particles.

17. The method of claim 1 in which step (a) includes placing an insulating substrate between a first and a second porous preform, thereby forming a preform unit and placing said preform unit in said forming chamber.

18. The method of claim 1 in which step (a) includes placing at least one insulating substrate between a first and a second porous preform, thereby forming a preform unit and placing said preform unit in said forming chamber.

19. The method of claim I in which said liquid phase metal is an aluminum alloy.

20. The method of claim 1 in which (a) includes placing at least one insulating substrate on at least one porous preform and said liquid phase metal is an aluminum alloy.

21. The method of claim 1 in which (a) includes placing at least one insulating substrate on at least one porous preform formed of particles selected from the group consisting of alumina, carbon, graphite, silicon carbide, boron carbide, silicon nitride, aluminum nitride, mullite, titanium boride, zirconium boride, silicon aluminum oxynitride (SiAlON) and combinations thereof.

22. The method of claim 1 in which (a) includes placing at least one insulating substrate on at least one porous preform formed from silicon carbide particles and said particles comprise 50–80 vol. % of the preform.

23. The method of claim 1 in which (a) includes placing at least one insulating substrate on at least one porous preform formed of silicon carbide, at least one insulating substrate formed of aluminum nitride and in which (c) includes infiltrating said preform with liquid phase metal of an aluminum alloy.

24. The method of claim 1 in which at least one insulating substrate is formed from boron nitride.

25. The method of claim 1 in which at least one insulating substrate is formed from aluminum oxide.

26. The metal matrix composite of claim 1 in which said metal matrix is formed from a metal selected from the group consisting of aluminum, copper, magnesium, iron, zinc, nickel, cobalt, titanium, beryllium, tungsten, gold, silver and alloys thereof.

27. A method of fabricating a metal composite comprising the steps of:

(a) placing at least one electrically insulating substrate on at least one porous preform in a forming chamber;

(b) introducing liquid phase metal into said forming chamber and infiltrating said at least one porous preform and covering a surface of said at least one electrically insulating substrate with said liquid-phase metal;

(c) solidifying said liquid-phase metal, thereby forming a composite comprising said at least one pourous perform, said at least one electrically insulating substrate and a metal layer, said metal layer coveting said surface of said at least one electrically insulating substrate; and (d) electrically isolating at least one region of said metal layer from another region of said metal layer by removing at least a portion of said metal layer therebetween.

28. The method of claim 27 in which at least one insulating substrate is a ceramic.

29. The method of claim 27 in which at least one insulating substrate is aluminum nitride.

30. A method of fabricating a metal matrix composite comprising the steps of:

(a) placing at least one aluminum nitride substrate on at least one porous silicon carbide preform in a forming chamber;

(b) introducing liquid phase metal from the group consisting of aluminum and aluminum alloy into said forming chamber and infiltrating said at least one silicon carbide preform and covering a surface of said at least one aluminum nitride substrate with said liquid phase aluminum alloy;

(c) solidifying said liquid phase aluminum alloy, thereby forming a composite comprising said at least one porous silicon carbide preform, said at least one aluminum nitride substrate and a metal layer, said metal layer covering said surface of said at least one aluminum nitride substrate; and (d) electrically isolating at least one region of said metal layer from another region of said metal layer or from the at least one infiltrated porous silicon carbide preform.

31. The method of claim 30 in which said liquid phase metal is aluminum.

* * * * *

UNITED STATES PATENT AND TRADEMARK OFFICE
CERTIFICATE OF CORRECTION

PATENT NO. : 5,570,502
DATED : November 5, 1996
INVENTOR(S) : Ralph R. Sawtell; M.K. Premkumar; David I. Yun and Eric T. Streicher It is certified that error appears in the above-indentified patent and that said Letters Patent is hereby corrected as shown below:

On the title page: Item [75] add -- Eric T. Streicher --.

| | |
|---|---|
| Col. 17, line 12<br>Claim 19 | Change "I" to --1--. |
| Col. 18, line 11<br>Claim 27 | Change "coveting" to --covering--. |
| Col. 18, line 30<br>Claim 30 | Change "aluminum alloy" to --metal--. |
| Col. 18, line 31<br>Claim 30 | Change "aluminum alloy" to --metal--. |

Signed and Sealed this

Twenty-second Day of July, 1997

Attest:

BRUCE LEHMAN

*Attesting Officer*     *Commissioner of Patents and Trademarks*